US010510619B2

(12) United States Patent
Lin et al.

(10) Patent No.: US 10,510,619 B2
(45) Date of Patent: Dec. 17, 2019

(54) SEMICONDUCTOR STRUCTURE AND METHOD FOR MANUFACTURING THE SAME

(71) Applicant: TAIWAN SEMICONDUCTOR MANUFACTURING COMPANY LTD., Hsinchu (TW)

(72) Inventors: Yu-Chang Lin, Hsinchu (TW); Shih-Hsiang Chiu, New Taipei (TW); Tien-Shun Chang, New Taipei (TW); Chun-Feng Nieh, Hsinchu (TW); Huicheng Chang, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/864,784

(22) Filed: Jan. 8, 2018

(65) Prior Publication Data
US 2019/0157163 A1    May 23, 2019

Related U.S. Application Data

(60) Provisional application No. 62/587,854, filed on Nov. 17, 2017.

(51) Int. Cl.
| H01L 21/31 | (2006.01) |
| H01L 21/8238 | (2006.01) |
| H01L 29/06 | (2006.01) |
| H01L 21/02 | (2006.01) |
| H01L 21/3115 | (2006.01) |

(52) U.S. Cl.
CPC ........... *H01L 21/823821* (2013.01); *H01L 21/02164* (2013.01); *H01L 21/31155* (2013.01); *H01L 21/823878* (2013.01); *H01L 29/0653* (2013.01)

(58) Field of Classification Search
None
See application file for complete search history.

(56) References Cited

U.S. PATENT DOCUMENTS

| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |
| 8,962,400 | B2 | 2/2015 | Tsai et al. |
| 9,093,514 | B2 | 7/2015 | Tsai et al. |
| 9,236,267 | B2 | 1/2016 | De et al. |
| 9,245,805 | B2 | 1/2016 | Yeh et al. |
| 9,520,482 | B1 | 12/2016 | Chang et al. |
| 9,576,814 | B2 | 2/2017 | Wu et al. |

(Continued)

*Primary Examiner* — Fernando L Toledo
*Assistant Examiner* — Valerie N Newton
(74) *Attorney, Agent, or Firm* — WPAT, P.C., Intellectual Property Attorneys; Anthony King

(57) ABSTRACT

The present disclosure provides a method for manufacturing a semiconductor structure. The method includes following operations. A plurality of fin structures and a plurality of trenches are formed over a semiconductor substrate, wherein the fin structures are spaced apart by the trenches, and the fin structures are covered by a mask layer. A dielectric layer is formed over the substrate, wherein the dielectric layer is in the plurality of trenches. The dielectric layer is annealed. A plurality of dopants in the dielectric layer are formed when the fin structures are covered by the mask layer.

20 Claims, 14 Drawing Sheets

(56) References Cited

U.S. PATENT DOCUMENTS

| | | | |
|---|---|---|---|
| 2015/0179503 A1* | 6/2015 | Tsai | H01L 21/76224 |
| | | | 257/347 |
| 2015/0187634 A1* | 7/2015 | Chiang | H01L 21/2636 |
| | | | 257/401 |
| 2017/0025535 A1* | 1/2017 | Wu | H01L 29/7843 |
| 2017/0178968 A1* | 6/2017 | Zhou | H01L 21/02271 |
| 2017/0256612 A1* | 9/2017 | Guillorn | H01L 29/0673 |
| 2018/0138209 A1* | 5/2018 | Liu | H01L 27/1211 |
| 2018/0145131 A1* | 5/2018 | Wang | H01L 21/0217 |

\* cited by examiner

US 10,510,619 B2

SEMICONDUCTOR STRUCTURE AND METHOD FOR MANUFACTURING THE SAME

CROSS-REFERENCE TO RELATED APPLICATION

This application claims the benefit of U.S. Provisional Application No. 62/587,854 filed Nov. 17, 2017.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

As the semiconductor industry has progressed into nanometer technology process nodes in pursuit of higher device density, higher performance and lower costs, challenges from both fabrication and design issues have resulted in the development of three-dimensional designs, such as the fin field effect transistor (FinFET). FinFETs are fabricated with a thin "fin" or "fin structure" vertically extending from a substrate, and a gate electrode is formed over the fin. Thus, the channel of the FinFET is formed. However, following a series of manufacturing operations, the fin structure may have some structure losses and thus impacts the electron mobility in the channel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
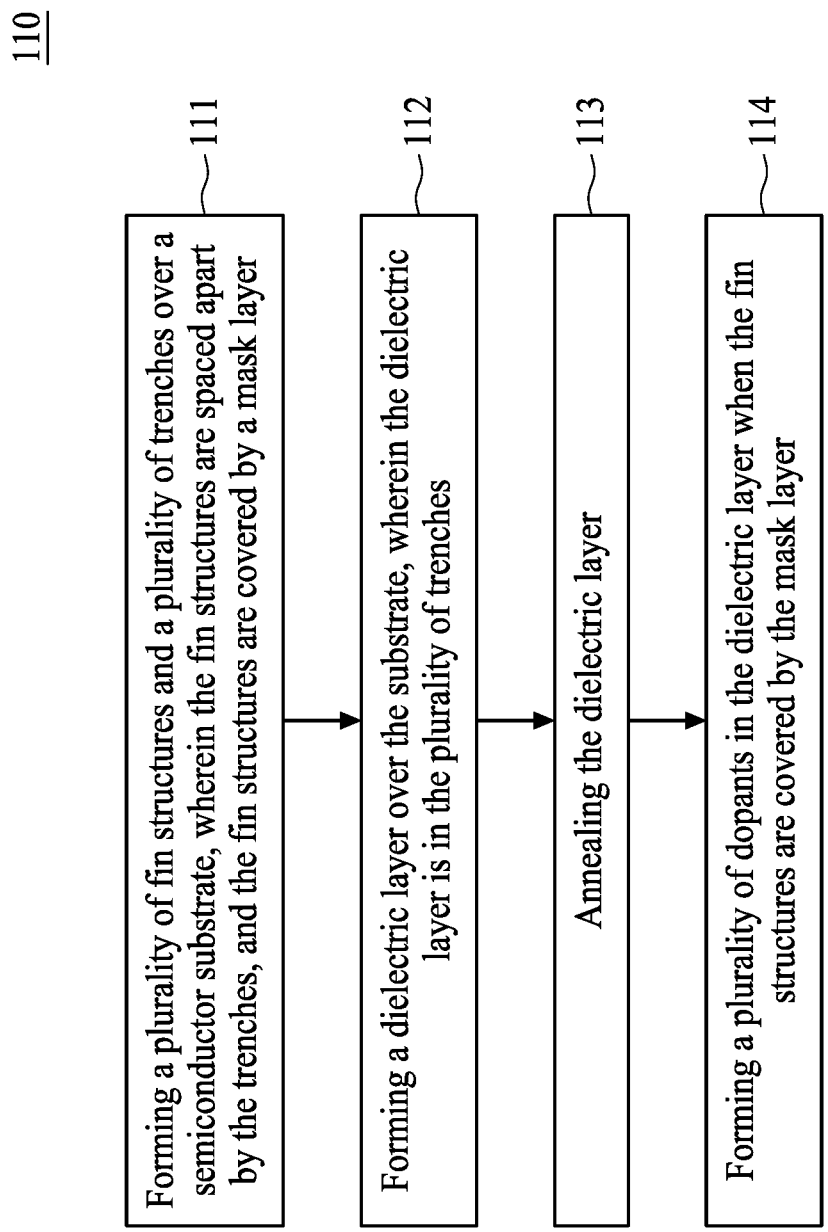
FIG. 1 is a flowchart illustrating a method of manufacturing a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In one or more embodiments, a plurality of dopants may be formed in the dielectric layer/isolation structure to alleviate the oxidation of the fin structures and improve the width of the fin structures to be wider. Consequently, the cross section of the fin structures may become larger. Since the electron mobility (unit: $cm^2/(V \cdot s)$) is proportion to the area of the cross section, the electron mobility may be enhanced. Further, the drain current of n-type/p-type MOS FinFET may be improved with the enhanced electron mobility.

Examples of devices that can benefit from one or more embodiments of the present disclosure are semiconductor devices such as, for example but not limited, a fin field effect transistor (FinFET) device. The FinFET device, for example, may be a complementary metal-oxide-semiconductor (CMOS) device including a p-type MOS FinFET device and an n-type MOS FinFET device. It is understood that the application should be not limited to a particular type of device, except as specifically claimed.

In some embodiments, to form a variety of planar and non-planar devices, the semiconductor substrate may include various doped regions depending on design requirements as known in the art (e.g., p-type wells or n-type wells). The doped regions are doped with p-type dopants, such as boron or BF2; n-type dopants, such as phosphorus or arsenic; or combinations thereof. The doped regions may be formed directly on the semiconductor substrate, in a P-well structure, in an N-well structure, in a dual-well structure, or on or within a raised structure. The semiconductor substrate may further include various active regions, such as regions configured for an N-type metal-oxide-semiconductor transistor device (NMOS) and regions configured for a P-type metal-oxide-semiconductor transistor device (PMOS).

Referring to FIG. 1, FIG. 1 is a flowchart illustrating a method of manufacturing a semiconductor structure, in accordance with some embodiments of the present disclosure. In some embodiments, the method 110 includes operations 111~114. In an operation 111, a plurality of fin structures and a plurality of trenches are formed over a semiconductor substrate. The fin structures are spaced apart by the trenches, and the fin structures are covered by a mask layer. In an operation 112, a dielectric layer is formed over the semiconductor substrate. In an operation 113, the dielectric layer is annealed. In an operation 114, a plurality of dopants are formed in the dielectric layer when the fin structures are covered by the mask layer.

The method 110 is merely an example, and is not intended to limit the present disclosure beyond what is explicitly recited in the claims. Additional operations can be provided before, during, and after the method 110, and some operations described can be replaced, eliminated, or moved around for additional embodiments of the method.

Figure 2:
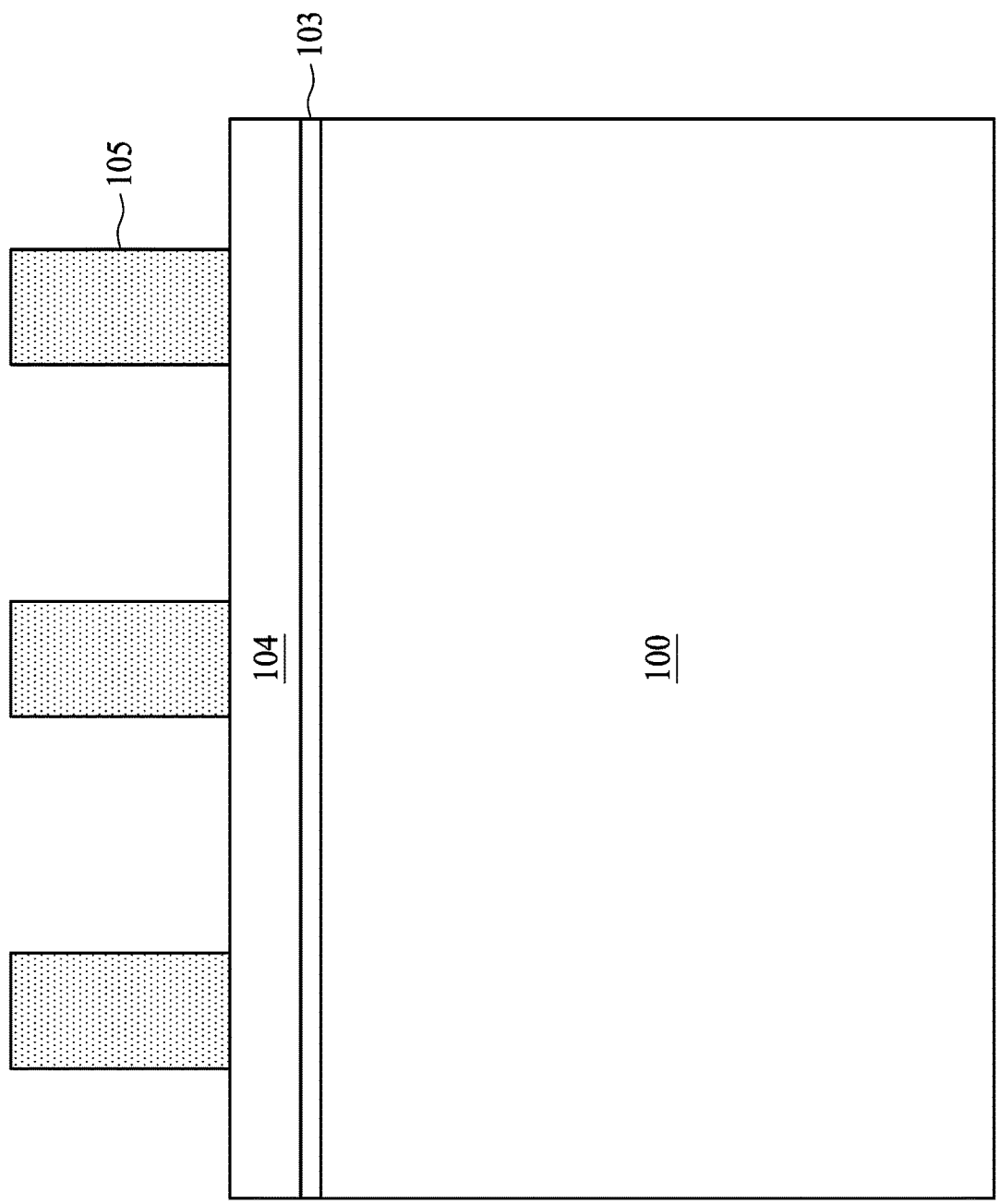
FIG. 2, FIG. 3, FIG. 4, FIG. 5, FIG. 6, FIG. 7, FIG. 8, FIG. 9, and FIG. 10 are cross sectional views of a semiconductor structure fabricated at various stages, in accordance with some embodiments of the present disclosure.

FIG. 2, FIG. 3, FIG. 4, FIG. 5, FIG. 6, FIG. 7, FIG. 8, FIG. 9, and FIG. 10, are cross sectional views of a semiconductor structure fabricated at various stages, in accordance with some embodiments of the present disclosure. Referring to FIG. 2 and operation 111 in FIG. 1, the semiconductor substrate 100 is illustrated and the semiconductor substrate 100 is used to form a plurality of fin structures and a plurality of trenches. In some embodiments, the semiconductor substrate 100 may include an elementary semiconductor, such as silicon or germanium in a crystalline structure; a compound semiconductor, such as silicon germanium, silicon carbide (SiC), gallium arsenic (GaAs), gallium phosphide (GaP), indium phosphide (InP), indium arsenide (InAs), and/or indium antimonide; or combinations thereof. In some embodiments, the substrate 100 is made of an alloy semiconductor such as silicon germanium (SiGe), silicon germanium carbide (SiGeC), gallium arsenic phosphide (GaAsP), gallium indium phosphide (GaInP), or the like. In some embodiments, the semiconductor substrate 100 includes an epitaxial layer. For example, the semiconductor substrate 100 includes an epitaxial layer overlying a bulk semiconductor. In some embodiments, the semiconductor substrate 100 can include a silicon-on-insulator (SOI) substrate or a germanium-on-insulator (GOI) substrate.

Referring to FIG. 2, the operation of forming the fin structures and the trenches is illustrated, but is not limited thereto. In some embodiments, a pad layer 103, a mask layer 104, and a photoresist layer 105 are formed over the semiconductor substrate 100. The photoresist layer 105 may be patterned e.g., by photolithography to partially expose the mask layer 104 and the pad layer 103. In some embodiments, the photoresist layer 105 may be removed after patterning of the mask layer 104 and the pad layer 103 and before the trench etching. In some embodiments, the photoresist layer 105 includes a photosensitive material that causes the photoresist layer 105 to undergo a property change when exposed to light. Alternatively, a photolithographic operation may be implemented, supplemented, or replaced by other methods such as maskless photolithography, electron-beam writing, and ion-beam writing.

Figure 3:
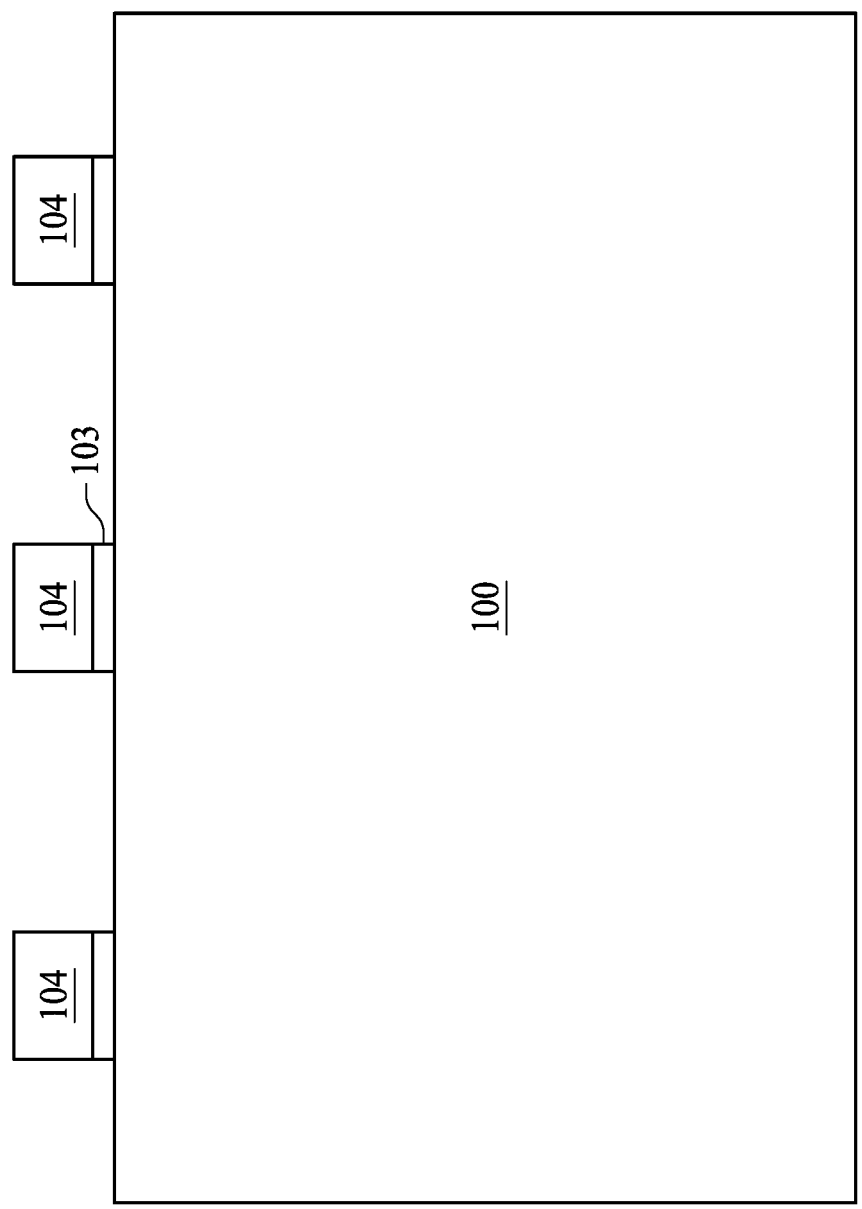

Referring to FIG. 3, the pad layer 103 and the mask layer 104 may be recessed to expose the portions of the semiconductor substrate 100. In some embodiments, the pad layer 103 may be a thin film formed of silicon oxide, for example, by using a thermal oxidation operation. The pad layer 103 may act as an adhesion layer between the semiconductor substrate 100 and the mask layer 104. The pad layer 103 may also act as an etch stop layer for etching the mask layer 104. In some embodiments, the mask layer 104 is formed of silicon nitride for example, using low-pressure chemical vapor deposition (LPCVD) or plasma enhanced chemical vapor deposition (PECVD). The mask layer 104 is used as a hard mask during subsequent patterning operations.

Figure 4:
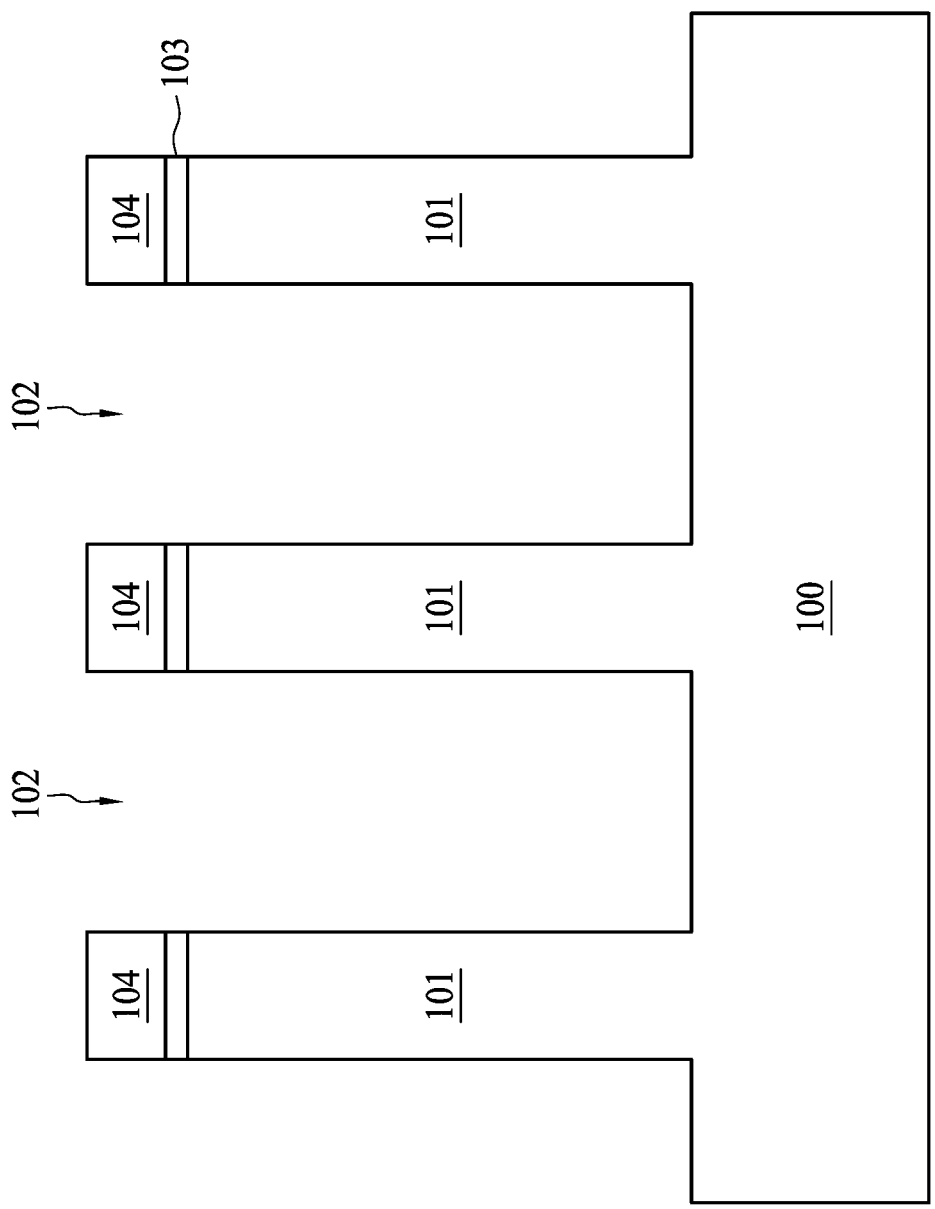

Referring to FIG. 4, in some embodiments, in the etching operation of the trenches 102, the semiconductor substrate 100 may be etched by various methods, including a dry etch, a wet etch, or a combination of dry etch and wet etch. In some embodiments, a wet cleaning operation may be performed to remove a native oxide of the semiconductor substrate 100. The portions of the semiconductor substrate 100 between trenches 102 form the fin structures 101.

Figure 11:
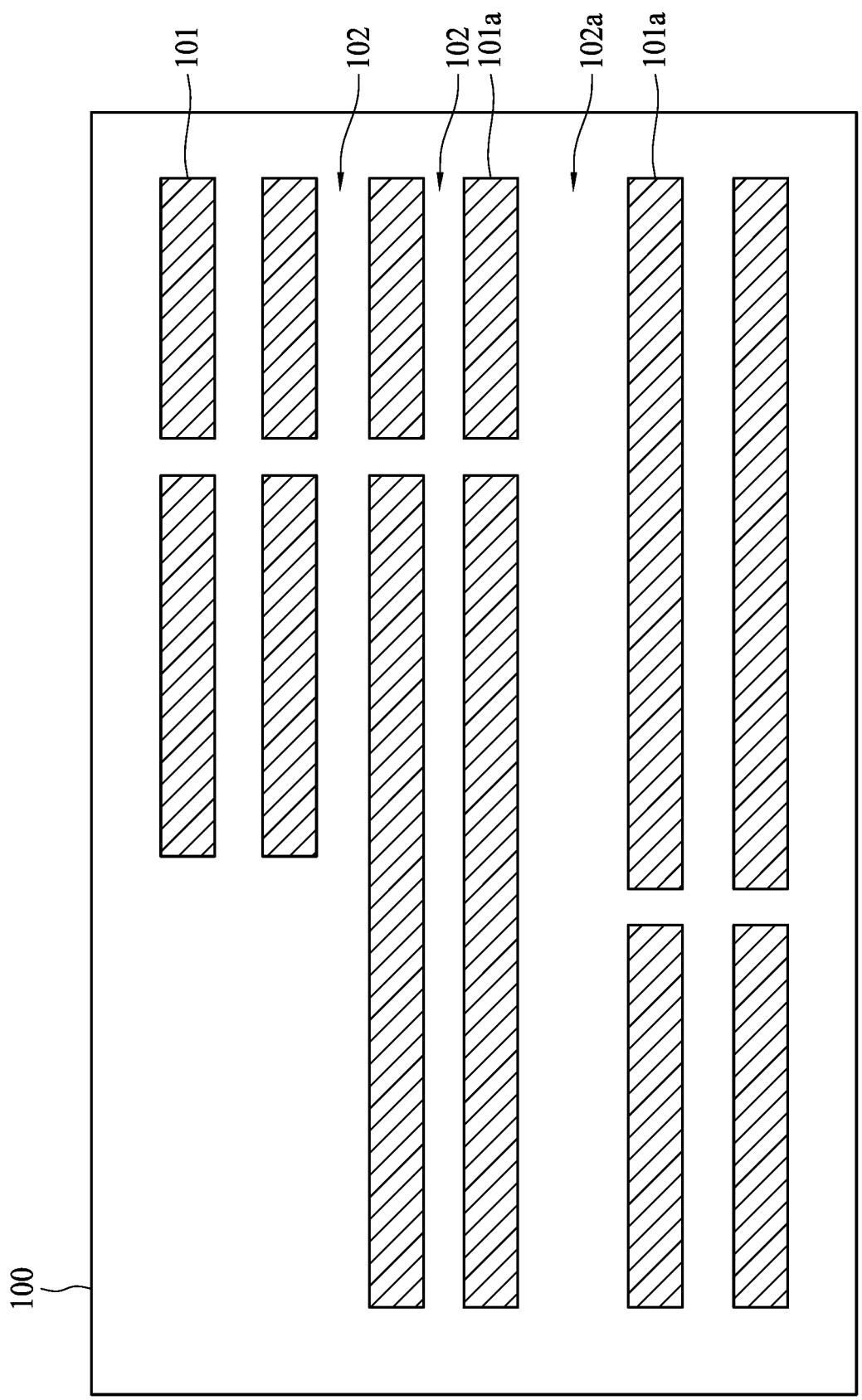
FIG. 11 is a top view of the semiconductor substrate fabricated at one stage, in accordance with some embodiments of the present disclosure.

Referring to FIG. 11, FIG. 11 is a top view of the semiconductor substrate 100 fabricated at one stage, in accordance with some embodiments of the present disclosure. In some embodiments, the fin structures 101 may be arranged in strips parallel to each other, and closely spaced by the trenches 102 with respect to each other. In some embodiments, the width of the trenches 102, 102a may be different at various portion. For examples, the trench 102a may be wider than the trench 102. The different width of the trenches 102, 102a may cause the fin structures 101a suffered different strain from two sides in the subsequent operations. Therefore, in some embodiments, the fin structure 101a adjacent to the wider trench 102a may have bending issue in the subsequent operations.

Figure 5:
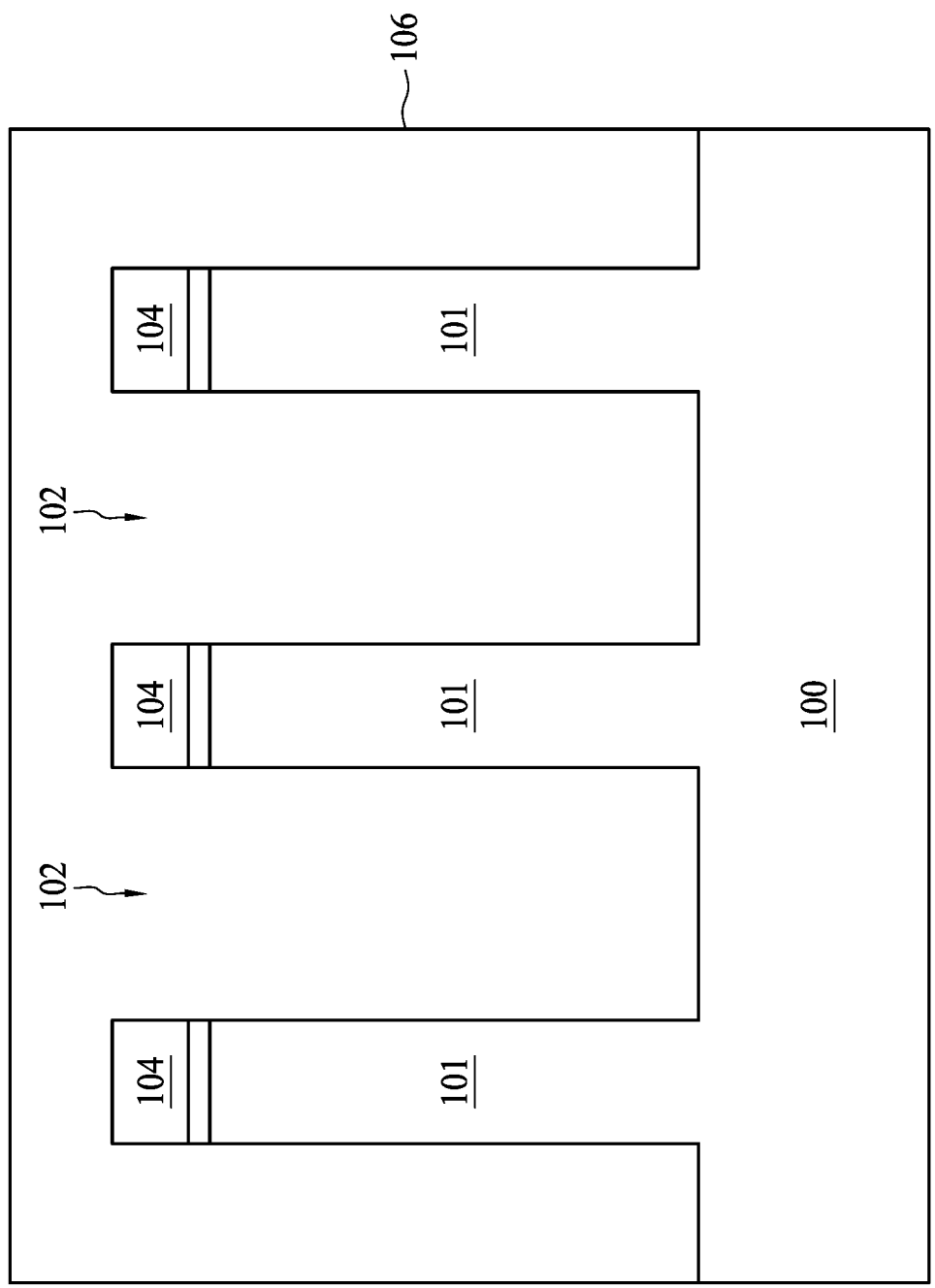

Referring FIG. 5 and the operation 112 in FIG. 1, the dielectric layer 106 is formed over the semiconductor substrate 100. In some embodiments, the dielectric layer 106 is formed in the plurality of trenches 102 and over the fin structures 101. In some embodiments, the dielectric layer 106 may be one or more isolation structures formed on the semiconductor substrate 100 to electrically isolate circuit devices such as the FinFET. In some embodiments, the dielectric layer 106 includes a shallow trench isolation (STI) structure.

In other embodiments, the dielectric layer 106 is a component of a silicon-on-insulator substrate. In some embodiments, the dielectric layer 106 takes the form of a buried oxide layer (BOX). In some embodiments, the dielectric layer 106 may include silicon oxide. In some embodiments, the dielectric layer 106 is made of, for example, silicon dioxide formed by LPCVD (low pressure chemical vapor deposition), plasma-CVD or flowable CVD. In the flowable CVD, flowable dielectric materials are deposited. Flowable dielectric materials, as their name suggests, can "flow" during deposition to fill gaps or spaces with a high aspect ratio. In some embodiments, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation. After the flowable film is deposited, it is cured and then annealed to remove un-desired element(s) to form silicon oxide. When the un-desired element(s) is removed, the flowable film densifies and shrinks. In some embodiments, multiple anneal operations are conducted. The flowable film is then cured and annealed. In some embodiments, the trenches 102 may have a multi-layer structure.

Figure 6:
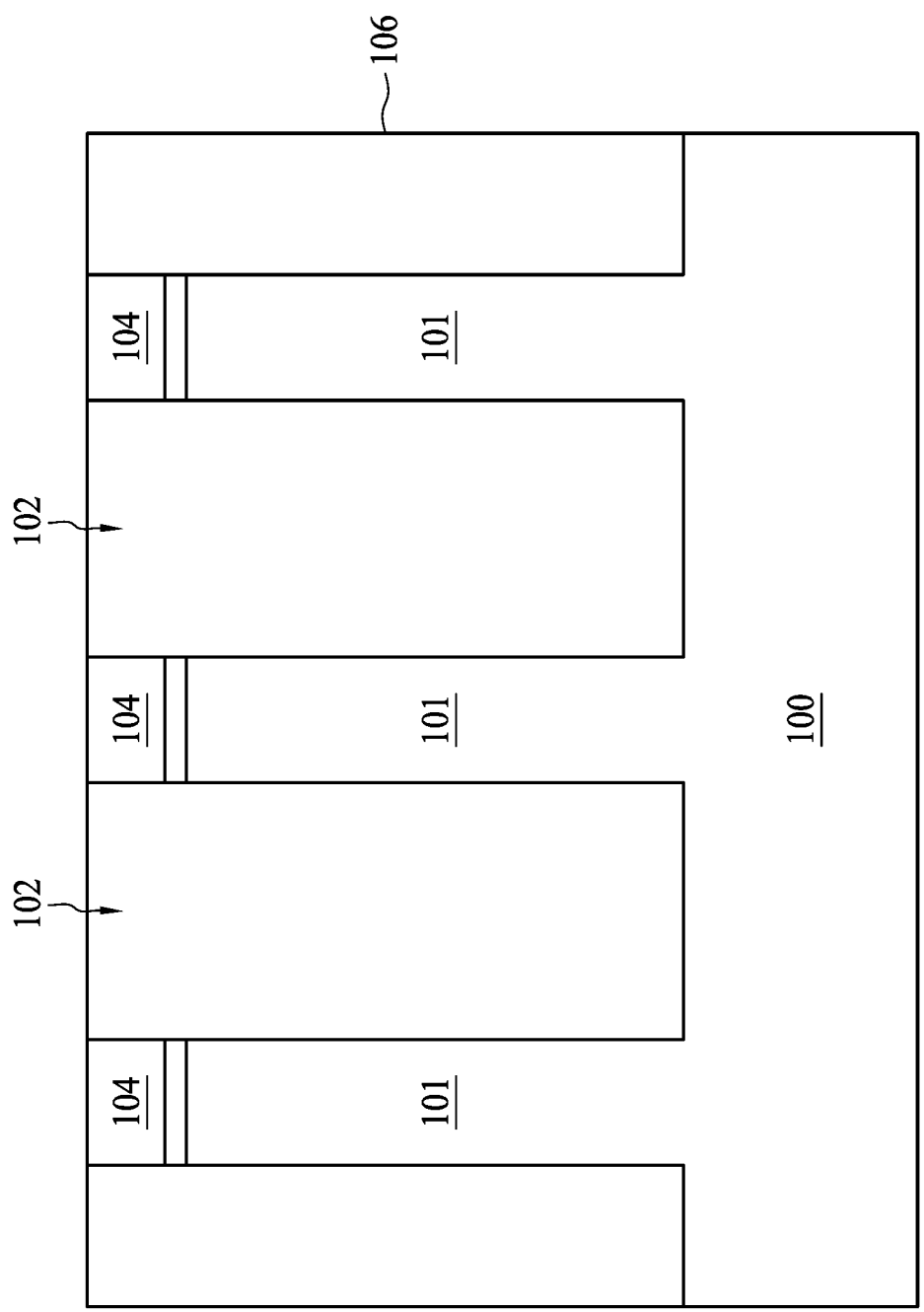

Referring to FIG. 6, in some embodiments, after the forming of the dielectric layer 106, a global planarization operation such as a chemical mechanical polishing (CMP) operation is performed to remove excessive portions of the dielectric layer 106 outside the trenches 102. As shown in FIG. 6, using the mask layer 104 as a polishing stop layer, after the excessive portions of the dielectric layer 106 are removed by the CMP operation, the remaining dielectric layer 106 is converted to temporary isolation structure filling the trenches 102.

Referring FIG. 6 and the operation 113 in FIG. 1, in some embodiments, the dielectric layer 106 is annealed. The annealing operation includes rapid thermal annealing (RTA), laser annealing operations, or other suitable annealing operations. In some embodiments, the annealing of the dielectric layer 106 includes recrystallizing the dielectric layer 106 and grain growth occurred in the dielectric layer 106. The annealing operation may densify and harden the isolation structure of the dielectric layer 106, and improve the quality of the dielectric layer 106. In some embodiments, the annealing operation is performed by using RTA at a temperature in a range of about 900° C. to about 1045° C., but not limited thereto.

Figure 7:
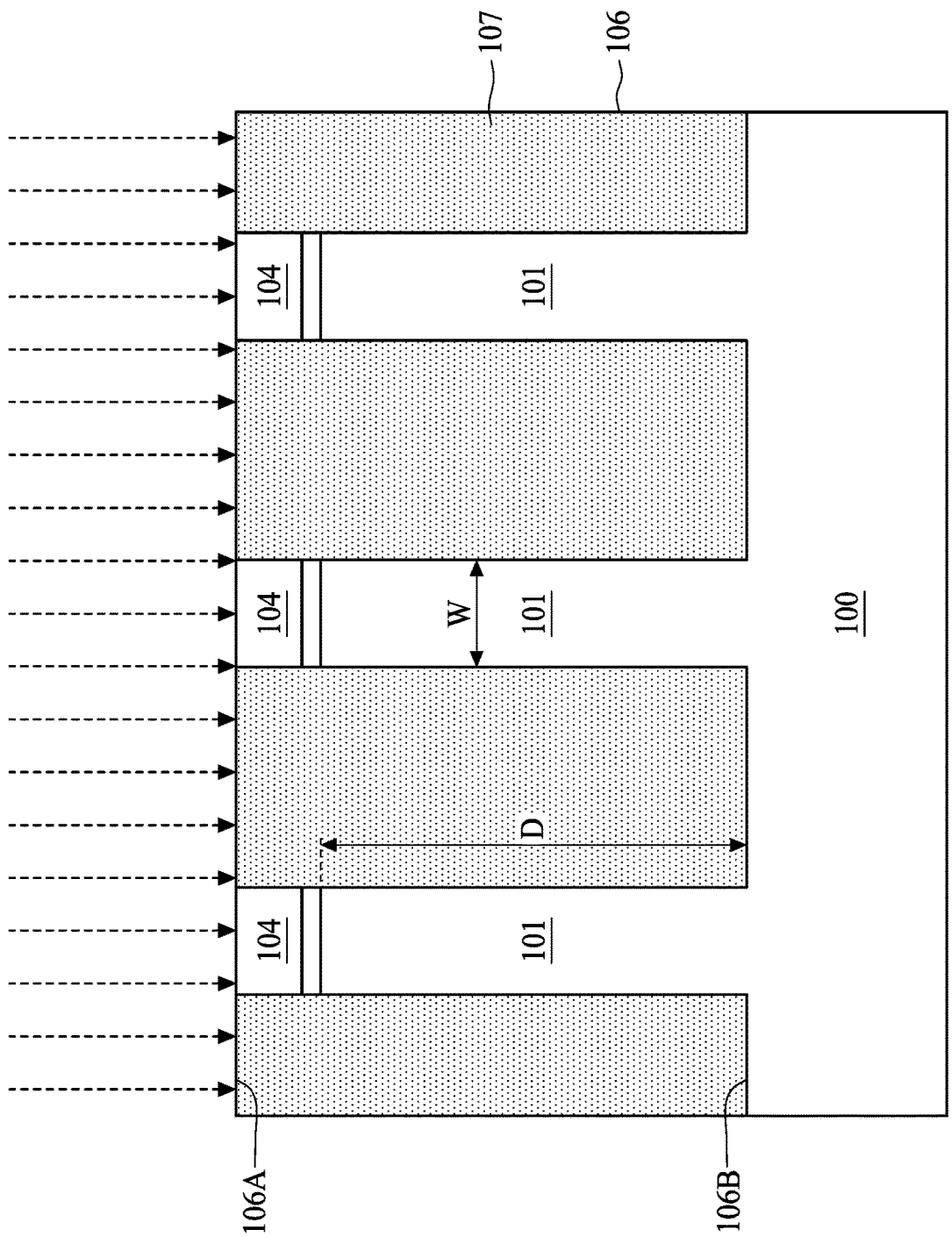

Referring FIG. 7 and the operation 114 in FIG. 1, in some embodiments, the plurality of dopants 107 are formed in the dielectric layer 106 when the fin structures 102 are covered by the mask layer 104. In some embodiments, the dopants 107 are mainly formed in the dielectric layer 106, and the mask layer 104 may block most of the dopants 107 from entering the fin structures 101. In some embodiments, forming the dopants 107 in the dielectric layer 106 includes performing an ion implantation. In some embodiments, the dopants 107 includes group III A elements, group IV A elements, group V A elements, or a combination thereof. In some embodiments, the dopants 107 includes nitrogen dopants, carbon dopants, germanium dopants, silicon dopants, or a combination thereof. In some embodiments, the a material of the dopants 107 may be the same or different from a material of the dielectric layer 106. In some embodiments, the dopants 107 formed in the dielectric layer 106 may provide tensile or compressive strength to the fin structures 101.

In some embodiments, during the implantation of the dopants 107, the dopants 107 may break the chemical bonds between the elements of the dielectric layer 106. Alternatively, the dopants 107 may form different chemical bonds with the elements of the dielectric layer 106. The broken chemical bonds or the formation of different chemical bonds may change the volume of the dielectric layer 106. In some embodiments, as some chemical bonds being broken or different chemical bonds being formed in the dielectric layer 106, the crystal structures in some portions of the dielectric layer 106 are altered. Consequently, the volume of the dielectric layer 106 may be expanded or deflated depending on the material of the dopants 107.

In some embodiments, the volume of the dielectric layer 106 is expanded, and the dielectric layer 106 may provide a compressive strain to the fin structures 101 to mitigate the bending issue of the fin structures 101. For examples, referring to FIG. 11, as described above, the fin structures 101a on the outer region of the semiconductor substrate 100 adjacent to the wider trench 102a may have bending issue. Consequently, the dielectric layer in the trenches 102a may provide a compressive strain to the fin structures 101a to mitigate the bending issue.

Further, referring to FIG. 7, in some embodiments, the dielectric layer 106 is made of, for example, silicon dioxide ($SiO_2$), and the material of the dopants is, for example, nitrogen dopant. The nitrogen dopant may incorporate into silicon dioxide to turn the dielectric layer 106 to a nitrogen-containing silicon oxide dielectric layer. With the nitrogen-containing silicon oxide dielectric layer, the oxidation of the fin structures 101 may be alleviated in the post anneal operation. Consequently, the loss of the fin structures may be alleviated and the width W of the fin structures may be wider than the condition without the implantation. This is merely examples and are not intended to be limiting.

In some embodiments, different materials of the dopants 107 may be used to alleviate the oxidation of the fin structures 101 and improve the width W of the fin structures 101. Consequently, the cross section of the fin structures 101 may become larger. Since the electron mobility (unit: $cm^2/(V \cdot s)$) is proportion to the area of the cross section, the electron mobility may be enhanced. Further, the drain current of n-type/p-type MOS FinFET may be improved with the enhanced electron mobility.

In some embodiments, the operation 113 of annealing the dielectric layer may be performed after the operation 114 of forming the plurality of dopants in the dielectric layer. In other words, the dielectric layer is not annealed before the forming of the dopants. In some embodiments, the annealing of the dielectric layer after the implantation includes recrystallizing the dielectric layer and the dopants. As described above, the annealing operation may densify and harden the structure of the dielectric layer and improve the quality of the dielectric layer. The orders of the annealing of the dielectric layer and the forming of the dopants are merely examples and are not intended to be limiting.

Figure 12:
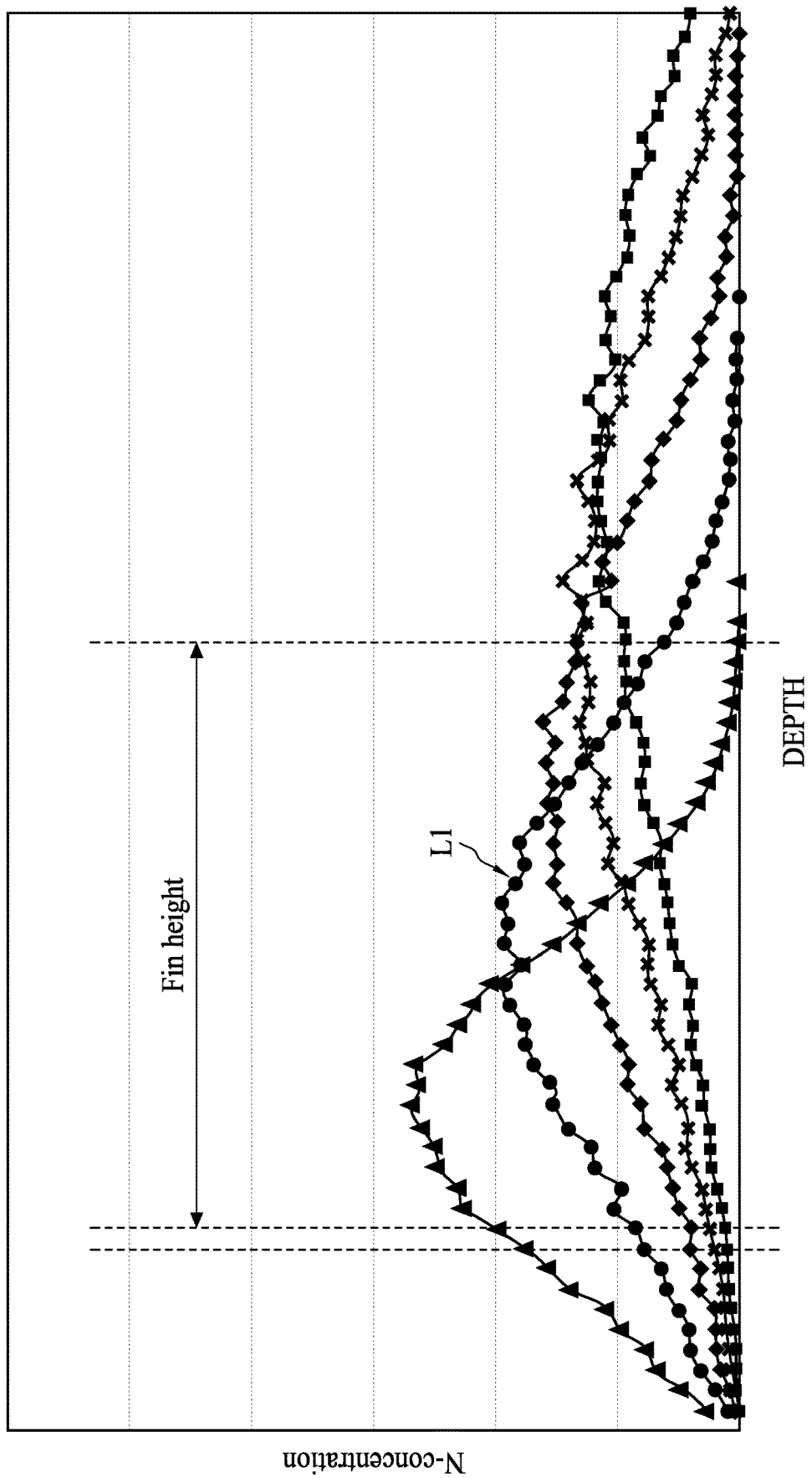
FIG. 12 is the doping profile of the dopants in the dielectric layer by different implantation energy, in accordance with some embodiments of the present disclosure.

Referring to FIG. 7 and FIG. 12, FIG. 12 is the doping profile of the dopants in the dielectric layer by different implantation energy, in accordance with some embodiments of the present disclosure. The dopants 107 may be implanted deeper with higher implantation energy. In some embodiments, the depth D (as shown in FIG. 7) corresponding to the fin structures 101 is, but not limited to, at a range about 200 A to about 780 A from the top surface 106A to the bottom surface 106B of the dielectric layer 106. In some embodiments, the highest density of the dopants 107 in the dielectric layer 106 may be around middle portion of the dielectric layer 106 (e.g. L1 in FIG. 12) and this may provide better effects to the fin structures 101, e.g. alleviating the bending of the fin structures 101. In some embodiments, a highest density of the dopants 107 in the dielectric layer 106 may be equal or lower than $2 \times 10^{15}/cm^3$. These are merely examples and are not intended to be limiting. For example, in some embodiments, the fin structure may have different height and thus the implantation energy may be variant, and the highest density of the dopants in the dielectric layer may also be different depending on the needs.

Figure 13:
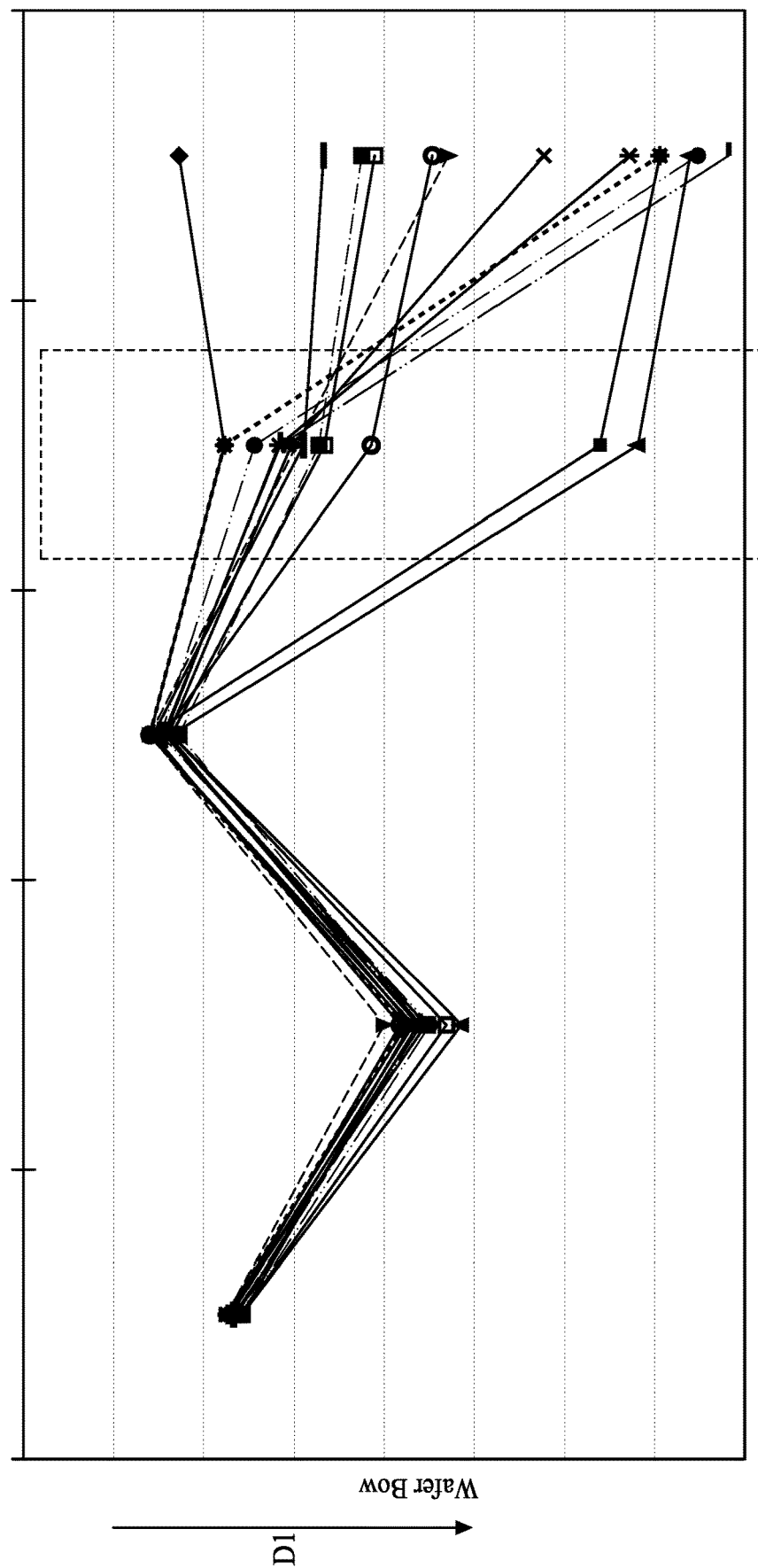
FIG. 13 is the wafer bow test data of the semiconductor structure, in accordance with some embodiments of the present disclosure.

Referring to FIG. 7 and FIG. 13, FIG. 13 is the wafer bow test data of the semiconductor structure, in accordance with some embodiments of the present disclosure. In some embodiments, after the implantation of the dopants 107, the semiconductor substrate 100 may bend in a direction D1 the same with the bending direction after the forming of the dielectric layer 106 (the dotted line area shown in FIG. 13). In other words, the implantation of the dopants 107 may compensate the semiconductor substrate 100's bow caused by the subsequent operations that may bend the substrate in a direction opposite to the direction D1.

Figure 8:
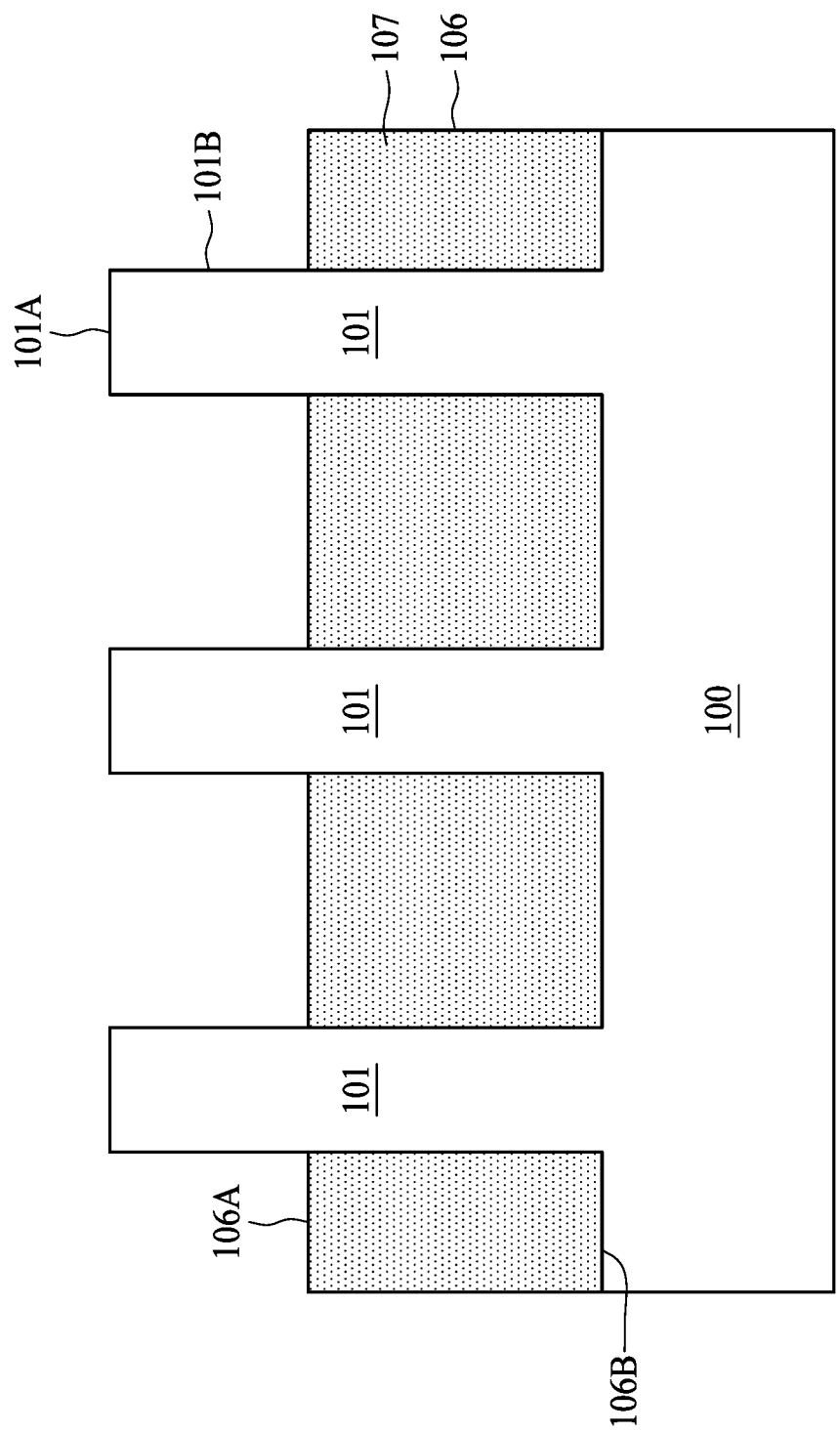

Referring to FIG. 8, in some embodiments, a portion of the dielectric layer 106 in the trenches 102 is removed. In some embodiments, an etching operation is performed to etch the dielectric layer 106 to expose upper portions of the fin structures 101. In some embodiments, the etched dielectric layer 106 forms the isolation structures. In some embodiments, the etched dielectric layer 106 may form as a shallow trench isolation (STI) structure. In some embodiments, the etching operation may include a dry etching operation, wet etching operation, or combination dry and wet etching operations to remove portions of the dielectric layer 106. It is understood that the etching operation may be performed as one etching operation or multiple etching operations. In some embodiments, the mask layer (104, shown in FIG. 7) and the pad layer (103, shown in FIG. 7) may be removed after the recessing of the dielectric layer 106.

In some embodiments, with the etching of the dielectric layer 106, the doping concentration of the dopants 107 in the dielectric layer 106 becomes to gradually decreased from a top surface 106A of the dielectric layer 106 to a bottom surface 106B of the dielectric layer 106. In some embodiments, depending on the etching depth of the dielectric layer 106 and the doping profile of the dopants, the doping concentration of the dopants 107 in the dielectric layer 106 may have different distribution.

In some embodiments, the upper portions of the fin structures 101 protruding over the top surfaces 106A of the dielectric layer 106 are used to form an active area, such as a channel region, of the semiconductor device (e.g. FinFET device). The upper portions of the fin structures 101 may include top surfaces 101A and sidewalls 101B.

Figure 14:
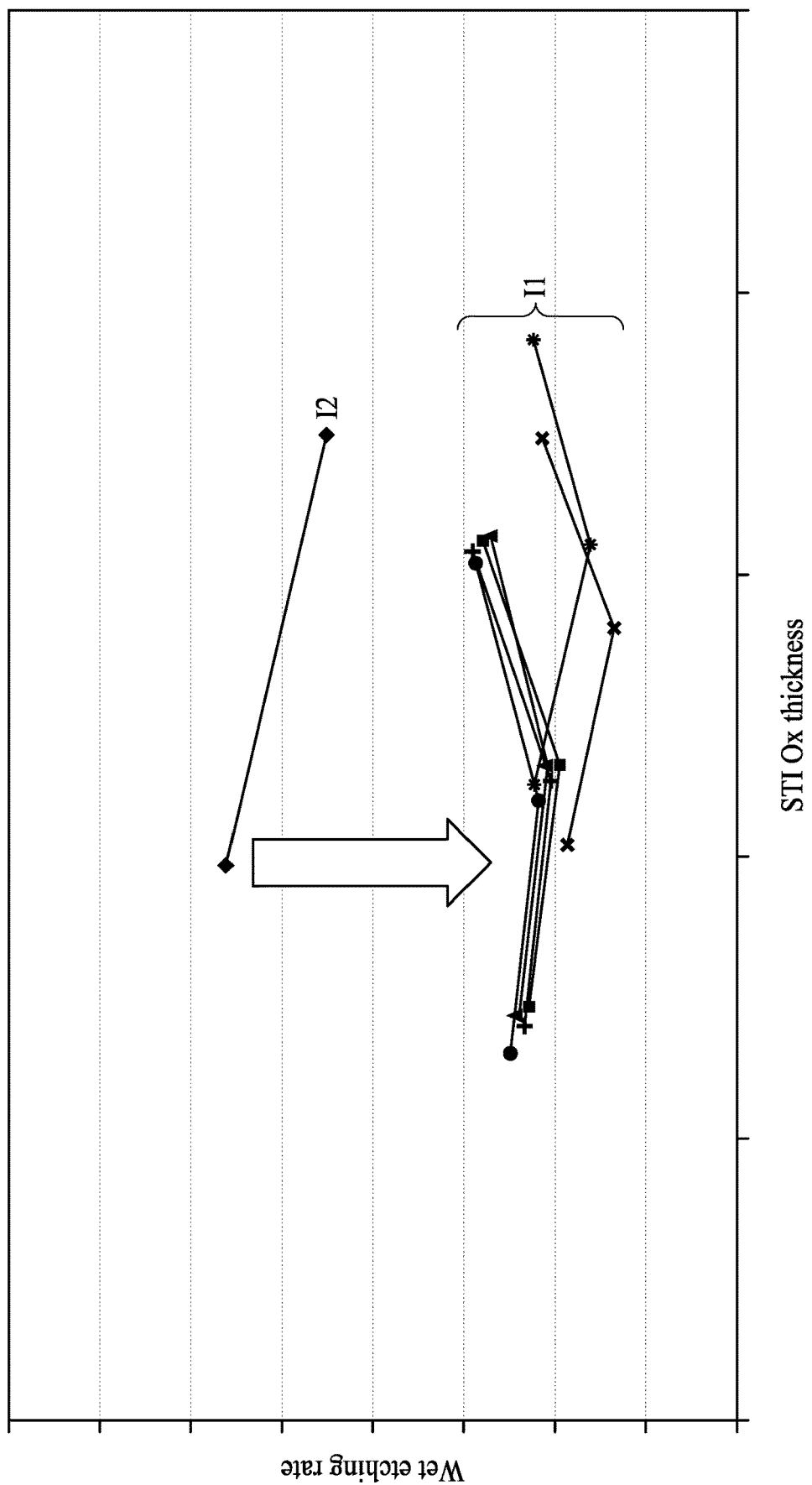
FIG. 14 is the wet etching rate (WER) of the dielectric layer with/without the implantation, in accordance with some embodiments of the present disclosure.

Referring to FIG. 8 and FIG. 14, FIG. 14 is the wet etching rate (WER) of the dielectric layer with/without the implantation, in accordance with some embodiments of the present disclosure. In some embodiments, the WER of the dielectric layer 106 with the implantation (e.g. 11 in FIG. 14) is lower than the dielectric layer without the implantation (e.g. 12 in FIG. 14). In some embodiments, the WER of the dielectric layer 106 with the implantation may have 40% reduction comparing to the dielectric layer without the implantation. In other words, the dielectric layer 106 with the implantation may have more densified structure and the implantation may improve the quality of the dielectric layer 106.

In some embodiments, when the dielectric layer 106 is annealed before the forming of the dopants, a supplementary annealing operation may be performed after the forming of the dopants 107. The supplementary annealing operation includes RTA, laser annealing operations, or other suitable annealing operations. In some embodiments, the supplementary annealing operation is performed by using RTA at a temperature in a range of about 900° C. to about 1045° C., but not limited thereto. In some embodiments, the annealing operation is performed by using RTA at a temperature about 950° C. to further improve the WER. The supplementary annealing operation may further densify and harden the structure of the dielectric layer 106 and improve the quality of the dielectric layer 106 after the implantation.

Figure 9:
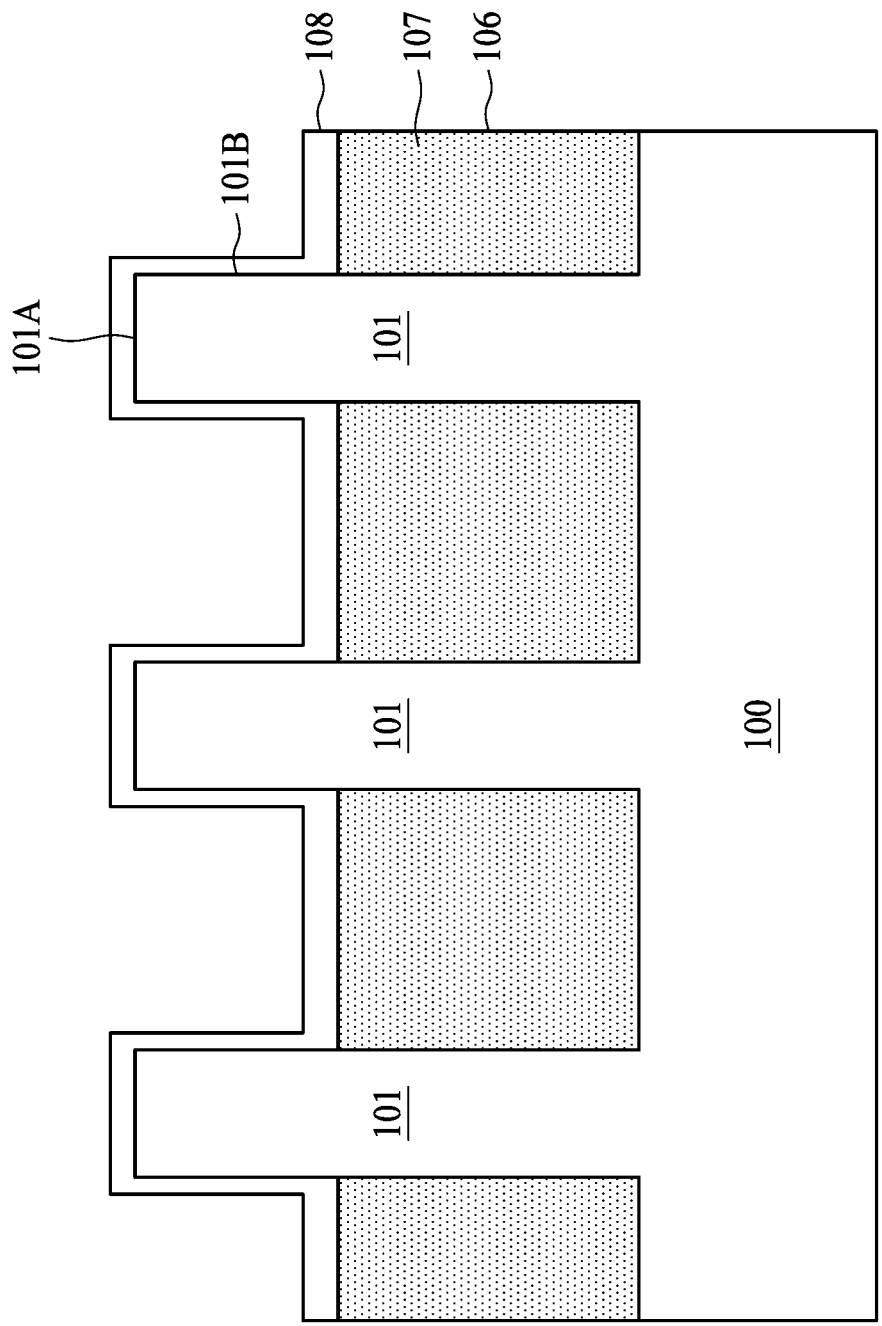

Referring to FIG. 9, in some embodiments, the gate dielectric layer 108 is formed over the fin structure 101 and the dielectric layer 106. In some embodiments, the gate dielectric layer 108 is formed to cover the top surface 101A and sidewalls 101B of at least a portion of the channel region of the fin structures 101. In some embodiments, the gate dielectric layer 108 includes one or more layers of silicon oxide, silicon nitride, silicon oxy-nitride, or high-k dielectrics. The gate dielectric layer 108 may be formed using a suitable operation such as atomic layer deposition (ALD), chemical vapor deposition (CVD), physical vapor deposition (PVD), thermal oxidation, UV-ozone oxidation, or combinations thereof. The gate dielectric layer 108 may further include an interfacial layer (not shown) to reduce damage between the gate dielectric layer 108 and the fin structures 101.

In some embodiments, an additional annealing operation may be performed after the gate dielectric layer 108 is formed. The additional annealing operation includes RTA, laser annealing operations, or other suitable annealing operations. In some embodiments, the additional anneal operation may further densify both the structure of the dielectric layer 106 with dopants 107 and the gate dielectric layer 108, and also improve the quality of the dielectric layer 106 with dopants 107 and the gate dielectric layer 108. In some embodiments, the additional annealing operation is performed by using RTA at a temperature in a range of about 900° C. to about 1045° C.

Figure 10:
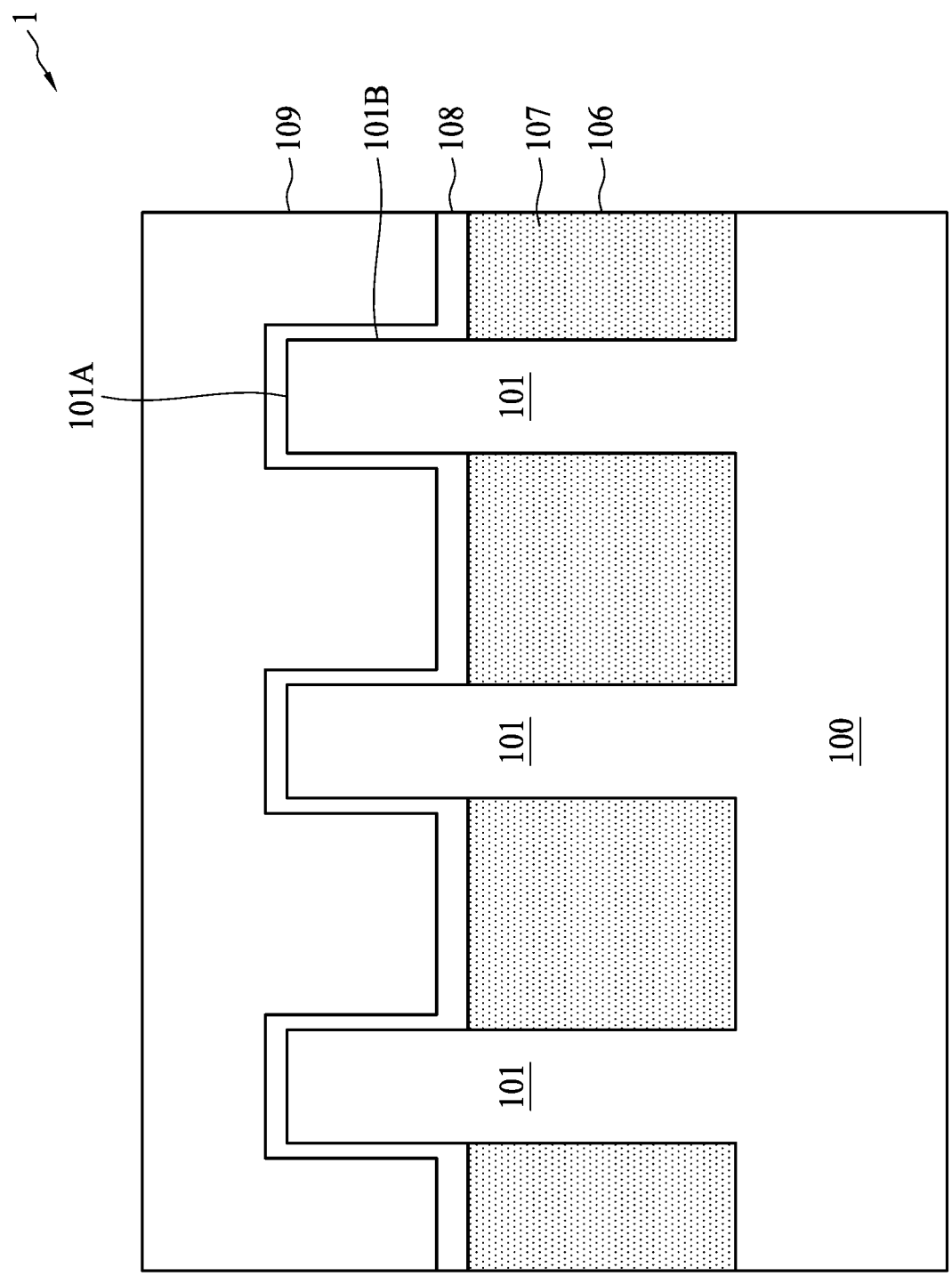

Referring to FIG. 10, in some embodiments, the gate electrode layer 109 is then formed on the gate dielectric layer 108. In some embodiments, the gate electrode layer 109 covers the upper portion of more than one fin structures 101. The gate electrode layer 109 may include a single layer or a multilayer structure. The gate electrode layer 109 may be formed using a suitable operation such as ALD, CVD, PVD, plating, or combinations thereof.

Referring to FIG. 10, the semiconductor structure 1 includes the semiconductor substrate 100, the fin structure 101 disposed over the semiconductor substrate 100, the isolation structure 106 disposed over the semiconductor substrate 100 at opposing sides of the fin structure 101, and the plurality of dopants 107 in the isolation structure 106. The semiconductor structure 1 serves only as one example. The semiconductor structure 1 and the method for manufacturing a semiconductor structure 1 may be used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

In one or more embodiments, the dopants formed in the dielectric layer/isolation structure may be alleviate the oxidation of the fin structures and improve the width of the fin structures to be wider. Consequently, the cross section of the fin structures may become larger. Since the electron mobility (unit: $cm^2/(V \cdot s)$) is proportion to the area of the cross section, the electron mobility may be enhanced. Further, the drain current of n-type/p-type MOS FinFET may be improved with the enhanced electron mobility.

Further, in one or more embodiments, the dopants formed in the dielectric layer/isolation structure may compensate the semiconductor substrate's bow caused by the subsequent operations. In one or more embodiments, the dopants formed in the dielectric layer/isolation structure may densify and harden the dielectric layer/isolation structure, and may improve the quality of the dielectric layer/isolation structure. Consequently, the WER of the dielectric layer/isolation structure with the implantation may be reduced comparing to the dielectric layer/isolation structure without the implantation.

According to one embodiment of the present disclosure, a method for manufacturing a semiconductor structure is provided. The method includes following operations. A plurality of fin structures and a plurality of trenches are formed over a semiconductor substrate, wherein the fin structures are spaced apart by the trenches, and the fin structures are covered by a mask layer. A dielectric layer is formed over the substrate, wherein the dielectric layer is in the plurality of trenches. The dielectric layer is annealed. A plurality of dopants in the dielectric layer are formed when the fin structures are covered by the mask layer.

According to another embodiment, a method for manufacturing a semiconductor structure is provided. The method includes following operations. A semiconductor substrate including a fin structure and a plurality of trenches at opposing sides of the fin structure is provided. A dielectric layer is formed in the plurality of trenches. A volume of the dielectric layer is expanded to compress the fin structure.

According to another embodiment, a semiconductor structure is provided. The semiconductor structure includes a semiconductor substrate, a fin structure disposed over the semiconductor substrate, an isolation structure disposed over the substrate at opposing sides of the fin structure, and a plurality of dopants in the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    forming a plurality of fin structures and a plurality of trenches over a semiconductor substrate, wherein the fin structures are spaced apart by the trenches, and the fin structures are covered by a mask layer;
    forming a dielectric layer over the substrate, wherein the dielectric layer is in the plurality of trenches;
    annealing the dielectric layer;
    removing the dielectric layer outside the plurality of trenches;
    forming a plurality of dopants in the dielectric layer when the fin structures are covered by the mask layer, after the removing the dielectric layer outside the plurality of trenches; and
    after the dopants are formed in the dielectric layer, lowering a top surface of the dielectric layer to a level below a top surface of the fin structures by referring to a distribution of a doping concentration of the dopants to remove a portion of the dielectric layer in the trenches, wherein a middle portion between the top surface at the level and a bottom surface of the dielectric layer has a highest density of the doping concentration.

2. The method of claim 1, wherein the annealing the dielectric layer is performed before the forming the plurality of dopants in the dielectric layer.

3. The method of claim 1, wherein the annealing the dielectric layer is performed after the forming the plurality of dopants in the dielectric layer.

4. The method of claim 1, wherein the plurality of dopants comprises group III A elements, group IV A elements, group V A elements, or a combination thereof.

5. The method of claim 4, wherein the plurality of dopants comprises nitrogen dopants, carbon dopants, germanium dopants, silicon dopants, or a combination thereof.

6. The method of claim 1, further comprising:
    after the portion of the dielectric layer in the trenches is removed, forming a gate dielectric layer over the fin structures and the dielectric layer.

7. The method of claim 1, wherein the forming the plurality of dopants in the dielectric layer comprises performing an ion implantation.

8. The method of claim 1, wherein the forming the plurality of fin structures and the plurality of trenches over the semiconductor substrate comprises:
    forming the mask layer over the semiconductor substrate, wherein the mask layer partially exposes the semiconductor substrate;
    recessing the semiconductor substrate exposed from the mask layer to form the plurality of trenches and the plurality of fin structures.

9. A method for manufacturing a semiconductor structure, comprising:
    providing a semiconductor substrate comprising a fin structure and a plurality of trenches at opposing sides of the fin structure;
    forming a mask layer covering a top surface of the fin structure;

forming a dielectric layer in the plurality of trenches;

removing the dielectric layer outside the plurality of trenches to lower a top surface of the dielectric layer to a level higher than the top surface of the fin structure; and expanding a volume of the dielectric layer having the top surface higher than the top surface of the fin structure to compress the fin structure, after the removing the dielectric layer outside the plurality of trenches.

10. The method of claim 9, wherein the expanding the volume of the dielectric layer comprises breaking a chemical bond between elements of the dielectric layer.

11. The method of claim 9, wherein the expanding the dielectric layer comprises:

implanting a plurality of dopants into the dielectric layer.

12. The method of claim 11, further comprising:

recrystallizing the dielectric layer before the implanting the plurality of dopants.

13. The method of claim 11, further comprising:

annealing the dielectric layer after the implanting the plurality of dopants to recrystallize the dielectric layer and the dopants.

14. The method of claim 11, wherein a material of the dopants is different from a material of the dielectric layer.

15. The method of claim 11, wherein the plurality of dopants comprises group III A elements, group IV A elements, group V A elements, or a combination thereof.

16. The method of claim 15, wherein the plurality of dopants comprises nitrogen dopants, carbon dopants, germanium dopants, silicon dopants, or a combination thereof.

17. The method of claim 11, wherein the mask layer is configured to block the plurality of dopants from entering the fin structure when implanting the plurality of dopants into the dielectric layer.

18. A semiconductor structure, comprising:

a semiconductor substrate;

a fin structure disposed over the semiconductor substrate;

an isolation structure disposed over the semiconductor substrate at opposing sides of the fin structure; and a plurality of dopants in the isolation structure, wherein a doping concentration of the dopants is gradually decreased from a top surface to a bottom surface of the isolation structure.

19. The semiconductor structure of claim 18, wherein the plurality of dopants comprises group III A elements, group IV A elements, group V A elements, or a combination thereof.

20. The semiconductor structure of claim 19, wherein the dopants comprises nitrogen dopants, carbon dopants, germanium dopants, silicon dopants, or a combination thereof.

* * * * *